(12) United States Patent
Hachino et al.

(10) Patent No.: US 7,242,606 B2
(45) Date of Patent: Jul. 10, 2007

(54) STORAGE APPARATUS AND SEMICONDUCTOR APPARATUS

(75) Inventors: Hidenari Hachino, Nagasaki (JP); Nobumichi Okazaki, Kanagawa (JP); Wataru Otsuka, Tokyo (JP); Tomohito Tsushima, Kanagawa (JP); Tsutomu Sagara, Nagasaki (JP); Chieko Nakashima, Nagasaki (JP); Hironobu Mori, Nagasaki (JP); Hajime Nagao, Nagasaki (JP)

(73) Assignee: Sony Corporation, Tokyo (JP)

( * ) Notice: Subject to any disclaimer, the term of this patent is extended or adjusted under 35 U.S.C. 154(b) by 62 days.

(21) Appl. No.: 11/225,593

(22) Filed: Sep. 13, 2005

(65) Prior Publication Data

US 2006/0067114 A1 Mar. 30, 2006

(30) Foreign Application Priority Data

Sep. 29, 2004 (JP) ............................ P2004-284500

(51) Int. Cl.
*G11C 11/00* (2006.01)
(52) U.S. Cl. ...................................... 365/148; 365/100
(58) Field of Classification Search ................ 365/148, 365/100, 163
See application file for complete search history.

(56) References Cited

U.S. PATENT DOCUMENTS

| 6,404,668 B2 * | 6/2002 | Kowarik et al. ............ 365/145 |
| 6,856,536 B2 * | 2/2005 | Rinerson et al. ............ 365/148 |
| 7,167,387 B2 * | 1/2007 | Sugita et al. ............... 365/148 |
| 2005/0248978 A1 * | 11/2005 | Chen et al. .................. 365/158 |

* cited by examiner

*Primary Examiner*—Anh Phung
(74) *Attorney, Agent, or Firm*—Sonnenschein Nath & Rosenthal LLP

(57) ABSTRACT

A storage apparatus includes memory devices each having a storage element with a characteristic that the application of an electric signal not lower than a first threshold signal allows the storage element to shift from a high resistance value state to a low resistance value state, and that the application of an electric signal not lower than a second threshold signal, which has a polarity different from that of the first threshold signal, allows the storage element to shift form a low resistance value state to a high resistance value state, and a circuit element connected to the storage element in series to be a load; wherein the memory devices are arranged in a matrix and one terminal of each of the memory devices is connected to a common line; and wherein an intermediate potential between a power supply potential and a ground potential is applied to the common line.

12 Claims, 8 Drawing Sheets

STORAGE APPARATUS AND SEMICONDUCTOR APPARATUS

BACKGROUND OF THE INVENTION

1. Field of the Invention

The present invention relates to a storage apparatus and a semiconductor apparatus. More specifically, the present invention relates to a storage apparatus and a semiconductor apparatus which are composed of memory devices each using a storage element storing and holding information according to an electric resistance state.

2. Description of Related Art

In information equipment such as a computer, high density DRAM (Dynamic Random Access Memory) with high operation speed is widely used as a random access memory.

However, since DRAM is volatile memory, which loses information upon turning off power, nonvolatile memory, which holds information after turning off power, has been desired.

As nonvolatile memory which is considered to be promising, there are proposed FeRAM (Ferroelectric Random Access Memory), MRAM (Magnetoresistive Random Access Memory), phase change memory, and resistance change type memory such as PMC (Programmable Metallization Cell) and RRAM.

The above-mentioned memories can hold written information for a long time without supplying power. Furthermore, it is considered that in the case of the above-mentioned memories, their non-volatility can make refreshing operation unnecessary and reduce power consumption.

Moreover, the resistance change type nonvolatile memory such as PMC and RRAM has a comparatively simple constitution in which a material having a property that a resistance value is changed by applying a voltage or a current is used for a storage layer storing and holding information, and two electrodes are provided so as to sandwich the storage layer therebetween and a voltage or a current are applied to these two electrodes. Therefore, the miniaturization of the storage element is easily achieved.

PMC has a structure in which an ionic conductor containing a predetermined metal is sandwiched between the two electrodes, and further, PMC utilizes a property that when causing the metal contained in the ionic conductor to be contained in either of the two electrodes and applying a voltage between the two electrodes, electric properties of the ionic conductor such as resistance or capacitance are changed.

More specifically, the ionic conductor is composed of a solid solution of chalcogenide and the metal (for example, amorphous GeS or amorphous GeSe), and either of the two electrodes contains Ag, Cu or Zn (for example, refer to Patent Document 1).

As a constitution of RRAM, there is introduced a constitution, for example, in which a polycrystalline PrCaMnO3 thin film is sandwiched between two electrodes and by applying voltage pulses or current pulses, a resistance value of the PrCaMnO3 which is a recording film is largely changed (for example, refer to Non-Patent Document 1). In addition, at information recording (writing) time and erasing time, voltage pulses different in polarity are applied.

Furthermore, as another constitution of RRAM, there is introduced a constitution, for example, in which SrZrO3 (monocrystal or polycrystal) with a small quantity of Cr doped is sandwiched between two electrodes, and by causing current to flow from these electrodes, the resistance of a recording film is changed (for example, refer to Non-Patent Document 2).

In this Non-Patent Document 2, I–V characteristics of the storage layer are shown and threshold voltages in recording and erasing are ±5 V. In this constitution, the application of voltage pulses also enables recording and erasing. A necessary pulse voltage is ±1.1 V and a voltage pulse width is 2 ms. Furthermore, high speed recording and erasing is enabled and the operation at a voltage pulse width of 100 ns is reported. In this case, a necessary pulse voltage is ±5 V.

However, at present, it is difficult for FeRAM to perform nondestructive reading and since it performs destructive reading, the reading speed is slow. Furthermore, since polarization reversal according to reading or recording is limited in number of times, writing is limited in number of times.

Furthermore, since MRAM needs a magnetic field for recording, and a current flowing through wiring generates the magnetic field, a large amount of current is necessary in recording.

Furthermore, the phase change memory is memory in which voltage pulses with the same polarity and different magnitudes are applied to perform recording. Since this phase change memory performs switching by using temperature, there is an issue that it is sensitive to changes in environmental temperature.

Furthermore, PMC described in Patent Document 1, a crystallization temperature of amorphous GeS or amorphous GeSe is about 200° C., and crystallization of the ionic conductor deteriorates the properties. Accordingly, PMC disadvantageously cannot endure high temperatures in a step of manufacturing a storage element, for example, in a step of forming a CVD insulating film, a protecting film or the like.

Moreover, since both of the materials of the storage layers proposed in the constitutions of RRAM's described in Non-Patent Document 1 and Non-Patent Document 2 are crystalline, RRAM has problems that thermal processing at about 600° C. is necessary, that it is extremely difficult to manufacture monocrystal of the proposed materials, that miniaturization is difficult because the use of polycrystal brings about the influence of grain boundary, etc.

Furthermore, in the above-described RRAM's, it is proposed that a pulse voltage is applied for recording and erasing of information. However, in the proposed constitutions, the resistance value of the storage layer is changed after recording, depending on the pulse width of the applied pulse voltage. Such dependency of the resistance value after recording on the pulse width of the recording indirectly means that the resistance value is changed even if the same pulse is repeatedly applied.

For example, in the above-described Non-Patent Document 1, it is reported that in the case where the pulses with the same polarity are applied, the resistance value after recording is largely changed, depending on the pulse width. The resistance value has a characteristic that in the case of a short pulse width of not more than 50 ns, a resistance change rate by recording is lower, and that in the case of a long pulse width of not less than 50 ns, as the pulse width becomes longer, the resistance value conversely approximates a resistance value before recording instead of being saturated at a certain value. Furthermore, Non-Patent Document 1 introduces features of a memory structure in which respective storage layers and MOS transistors for access control are connected in series, and arranged in an array.

Here, it is reported that when the pulse width is changed within a range of 10 ns to 100 ns, the resistance value of the storage layer after recording is changed according to the pulse width. In the case of a still longer pulse width, the resistance is predicted to decrease again due to the property of the storage layer.

Namely, in RRAM, since the resistance value after recording depends on the magnitude of the pulse voltage and the pulse width, fluctuations in the magnitude of the pulse voltage and the pulse width cause fluctuations in the resistance value after recording.

Accordingly, a pulse voltage with a pulse width shorter than about 100 ns has a low resistance change rate by recording and easily comes under the influence of the fluctuations in the resistance value after recording. Therefore, it is difficult to perform stable recording.

Consequently, when recording at such a short-pulse voltage, a process (verification) of checking contents of information after recording needs to be performed in order to ensure recording.

For example, before recording, a process of reading and checking contents of information recorded on a storage element (resistance values of the storage layer), and recording is performed corresponding to a relationship between the checked contents (resistance values) and contents to be recorded (resistance values). Alternatively, for example, after recording, a process of reading and checking contents of information recorded on the storage element, and when the checked resistance is different from a desired resistance value, re-recording is performed to correct the resistance value to the desired one.

The above-described processes makes the time required for recording longer, and thus makes it difficult to overwrite data or the like at a high speed.

In order to solve the above-described problems, there is proposed a storage apparatus including a memory cell having a storage element having a characteristic that the application of a voltage not lower than a threshold voltage between both terminals changes a resistance value, and a circuit element connected to the storage element in series, which is a load, and the storage apparatus has a characteristic that when the voltage applied between respective terminals of the storage element and the circuit element is not lower than a certain voltage which is higher than the threshold voltage, a combined resistance value of the storage element and the circuit element of the memory cell after the storage element has been changed from a high resistance value state to a low resistance value state becomes an almost steady value regardless of the magnitude of the voltage (refer to Patent Document 2). This storage apparatus realizes stable recording and shortens the time required for recording of information.

[Patent Document 1] National Publication of Japanese Patent Application Translation No. 2002-536840

[Non-Patent Document 1] "Novel Colossal Magnetoresistive Thin Film Nonvolatile Resistance Random Access Memory (RRAM)" by W. W. Zhuang et al., Technical Digest "International Electron Devices Meeting", 2002, pp. 193

[Non-Patent Document 2] "Reproducible switching effect in thin oxide films for memory applications", by A. Beck et al., Applied Physics Letters, 2000, Vol. 77, pp. 139–141,

[Patent Document 2] Specification of Japanese Patent Application No. 2004-22121

When the operation of changing a storage element from a high resistance value state to a low resistance value state is defined as writing and the operation of changing the storage element from a low resistance value state to a high resistance value state is defined as erasing, in order to realize the writing and erasing in the storage apparatus described in Patent Document 2, a range of a voltage applied to a memory cell needs to be defined, and the application of a voltage within the predetermined range to the memory cell enables the writing and erasing in the storage apparatus.

SUMMARY OF THE INVENTION

The present invention is to be achieved in light of the above-described issues, and there is a need for providing a storage apparatus and a semiconductor apparatus which enables stable recording, and can shorten the time required for recording of information, while realizing writing and erasing.

In order to fulfill the above-described need, a storage apparatus according to one embodiment of the present invention includes memory devices each having a storage element with a characteristic that the application of an electric signal not lower than a first threshold signal allows the storage element to shift from a high resistance value state to a low resistance value state, and that the application of an electric signal not lower than a second threshold signal, which has a polarity different from that of the first threshold signal, allows the storage element to shift form a low resistance value state to a high resistance value state, and a circuit element connected to the storage element in series to be a load, wherein the memory devices are arranged in a matrix and one terminal of each of the memory devices is connected to a common line and an intermediate potential between a power supply potential and a ground potential is applied to the common line.

Here, a common potential applied to the terminal of each of the memory devices is set to the intermediate potential which is a predetermined potential within a range from the ground potential to the power supply potential (not including the ground potential and the power supply potential), which enables the writing and erasing of the storage element.

More specifically, the intermediate potential is set within a range in which the application of the electric signal not lower than the first threshold signal to the storage element allows a resistance value of the storage element to change from a high state to a low state, thereby enabling the writing into the storage element. Also, the intermediate potential is set within a range in which the storage element which has come into the low resistance value state by applying the electric signal not lower than the first threshold signal can shift from the low resistance value state to the high resistance value state, thereby enabling the erasing of the storage element. Namely, the intermediate potential is set to a range in which the application of the electric signal not lower than the first threshold signal to the storage element allows the resistance value of the storage element to change from the high state to the low state, and at the same time, the storage element which has come into the low resistance value state by applying the electric signal not lower than the first threshold signal can shift from the low resistance value state to the high resistance value state, thereby enabling the writing and erasing of the storage element.

If in spite of the application of the electric signal not lower than the second threshold signal to the storage element, the storage element which has come into the low resistance value state by applying the electric signal not lower than the first threshold signal cannot shift from the low resistance value state to the high resistance value state, the erasing of the storage element into which the writing has been performed is disabled.

Furthermore, the storage element is structured in such a manner that a storage layer is sandwiched by a first electrode and a second electrode, and the application of the electric signal not lower than the first threshold signal between the first electrode and the second electrode allows the storage element to shift from the high resistance value state to the low resistance value state, and the application of the electric signal not lower than the second threshold signal between the first electrode and the second electrode allows the store element to shift from the lower resistance value state to the high resistance value state.

In order to fulfill the above-described need, a semiconductor apparatus according to another embodiment of the present invention has a storage apparatus including memory devices each having a storage element with a characteristic that the application of an electric signal not lower than a first threshold signal allows the storage element to shift from a high resistance value state to a low resistance value state, and that the application of an electric signal not lower than a second threshold signal, which has a polarity different from that of the first threshold signal, allows the storage element to shift form a low resistance value state to a high resistance value state, and a circuit element connected to the storage element in series to be a load, wherein the memory devices are arranged in a matrix and one terminal of each of the memory devices is connected to a common line and an intermediate potential between a power supply potential and a ground potential is applied to the common line.

Here, the provision of the potential supply means for applying the intermediate potential as the common potential to the terminal of each of the memory devices enables the writing and erasing of the storage element.

In the above-described storage apparatus and the semiconductor apparatus of the present invention, stable recording of information can be performed, and the time required for recording the information can be shortened, while the writing and erasing are realized.

Further features of the invention, and the advantages offered thereby, are explained in detail hereinafter, in reference to specific embodiments of the invention illustrated in the accompanying drawings.

DESCRIPTION OF THE PREFFERED EMBODIMENTS

Hereinafter, the embodiment of the present invention is described with reference to the drawings to help understanding of the present invention. In the present embodiment, a resistance change type storage element (hereinafter, referred to as a memory element) is used in a memory cell to compose a storage apparatus.

Figure 1:
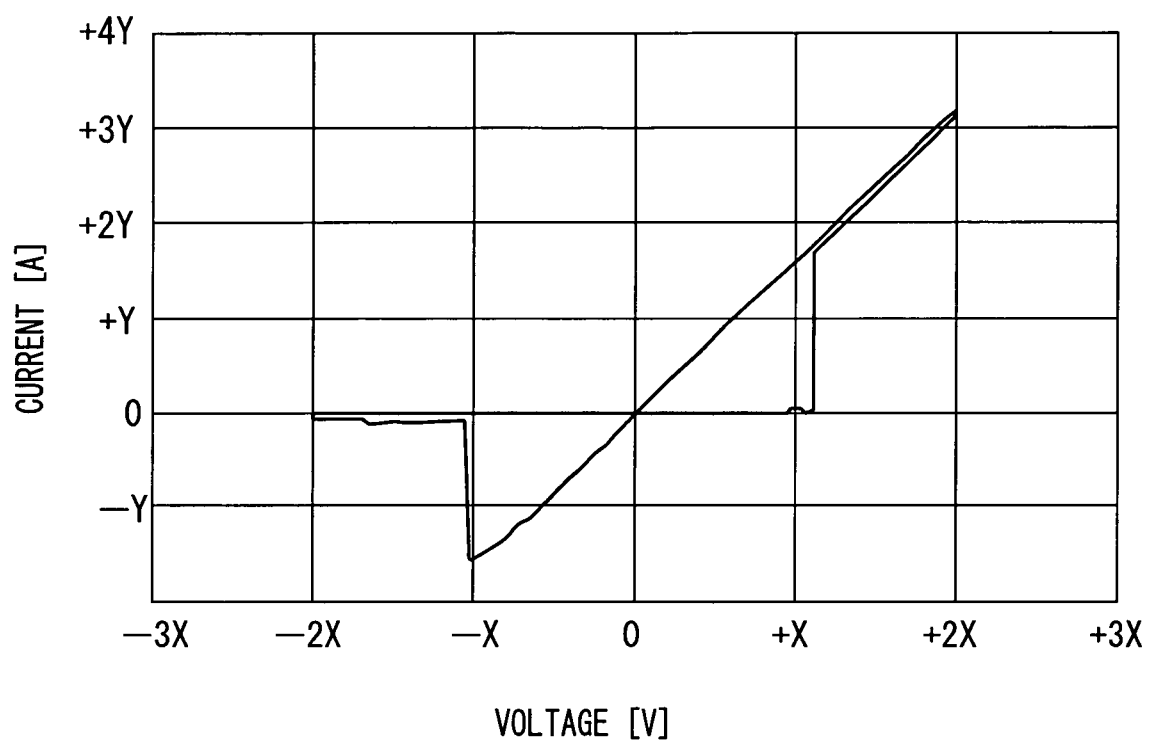
FIG. 1 is a graph showing changes in current-voltage of a memory element used in one example of a storage apparatus to which the present invention is applied.

FIG. 1 is a graph showing changes in current-voltage (I–V) of a memory element used in one example of a storage apparatus to which the present invention is applied.

As the memory element having I–V characteristics as shown in FIG. 1, there is exemplified a storage element which is structured such that a storage layer is sandwiched between a first electrode and a second electrode (for example, a lower electrode and an upper electrode) and such that the storage layer is composed of an amorphous thin film such as a rare earth oxide film, for example.

In this memory element, a resistance value in an initial condition is high (for example, M$\Omega$ or higher), which is a state in which it is difficult for a current to flow. However, when a voltage of +1.1×[V] or higher (for example, +0.5 V) as shown in FIG. 1 is applied, the current is rapidly increased and the resistance value is decreased (for example, several k$\Omega$). The memory element transits to a state having an ohmic characteristic, in which the current flows in proportion to the voltage, namely, the resistance value shows a constant value, and then even if the voltage is returned to 0 V, the resistance value (low resistance value) is held.

Hereinafter, this operation is referred to as writing, and this state is referred to as conduction. An applied voltage at this time is referred to as a writing voltage threshold.

Next, a voltage having a reverse polarity to the writing is applied to the memory element, and the applied voltage is increased. Then, the current flowing through the memory element is rapidly decreased at −1.1× [V](for example, −0.5 V) as shown in FIG. 1, namely, the resistance value is rapidly increased, and changed to a high resistance value as in the initial condition (for example, 1 M$\Omega$ or higher). Thereafter, even if the voltage is returned to 0 V, the resistance value (high resistance value) is held.

Hereinafter, this operation is referred to as erasing, and this state is referred to as insulation. Furthermore, the applied voltage at this time is referred to as an erasing voltage threshold.

In this manner, the application of positive and negative voltages to the memory element allows the resistance value of the memory element to be reversibly changed from several k$\Omega$ to about 1 M$\Omega$. Furthermore, when the voltage is not applied to the memory element, namely, when the voltage is 0 V, two states of conduction and insulation can be taken, and these states are made to correspond to data 1 and data 0, respectively, and are each stored as one bit of data.

In FIG. 1, the range of the applied voltage is from −2× to +2×. Even if the applied voltage is increased beyond this range, the resistance value is hardly changed in the memory element used for one example of the storage apparatus to which the present invention is applied.

FIG. 2 is a circuit diagram for explaining a memory cell used in one example of the storage apparatus to which the present invention is applied. A memory cell C shown here is structured by connecting a MOS transistor T to a memory element A in series. Thereby, the MOS transistor acts not only as a switching element for selecting a memory element to be accessed, but as a load to the memory element at the time of writing as described later.

Furthermore, the constitution is such that a terminal voltage V1 is applied to a terminal of the memory element on the opposite side of a terminal connected to the MOS transistor, and a terminal voltage V2 is applied to a terminal of the MOS transistor (for example, terminal on the source side) on the opposite side of a terminal connected to the memory element, and a gate voltage Vgs is applied to a gate of the MOS transistor.

By applying the terminal voltages V1 and V2 on the respective terminals of the memory element and the MOS transistor composing the memory cell, a potential difference V (=|V2−V1|) is generated between both of the terminals.

It is desirable that the resistance value at the time of writing of the memory element is at the same level as an on-resistance of the MOS transistor or higher. This is because if the resistance value of the memory element at the start time of writing is low, most of the potential difference applied between the terminals is applied to the MOS transistor, so that power is lost and the applied voltages cannot be efficiently used for changes of the resistance of the memory element. However, according to the present embodiment, since the resistance value of the memory element at the time of writing start is sufficiently high, most of the voltage is applied to the memory element, so that the above-mentioned problem does not arise.

Figure 2A:
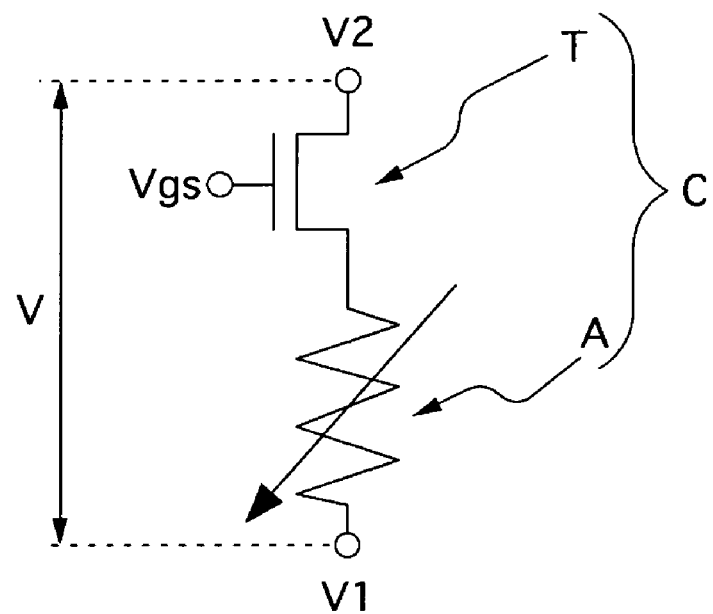
FIGS. 2A and 2B are circuit diagrams for explaining a memory cell used in one example of the storage apparatus to which the present invention is applied.
Figure 2B:
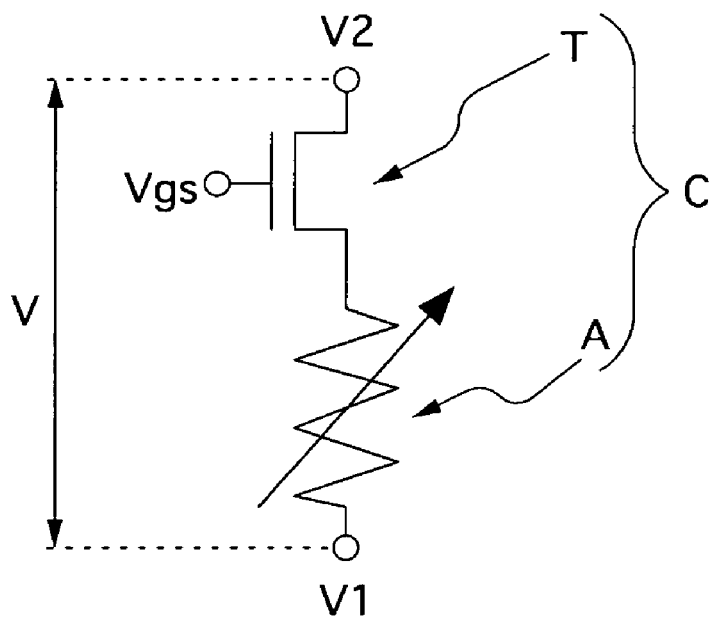

Here, two types of structures of memory devices based on the polarity of the memory element and the MOS transistor are considered as shown in FIG. 2A and FIG. 2B.

Each of arrows of the memory devices in FIG. 2 indicates its polarity, and shows that when a voltage is applied in the arrow direction, the memory element shifts from an insulation state to a conduction state, that is, performs writing operation.

FIGS. 3 to 6 are circuit diagrams for explaining one example of the storage apparatus to which the present invention is applied. Memory arrays shown here are each formed by arranging the memory devices shown in FIG. 2 in a matrix. Based on the relationships of the polarity of the memory element and MOS transistor and the arrangement of the memory element and the MOS transistor, four types of memory array structures as shown in FIGS. 3, 4, 5 and 6 can be considered.

Figure 3:
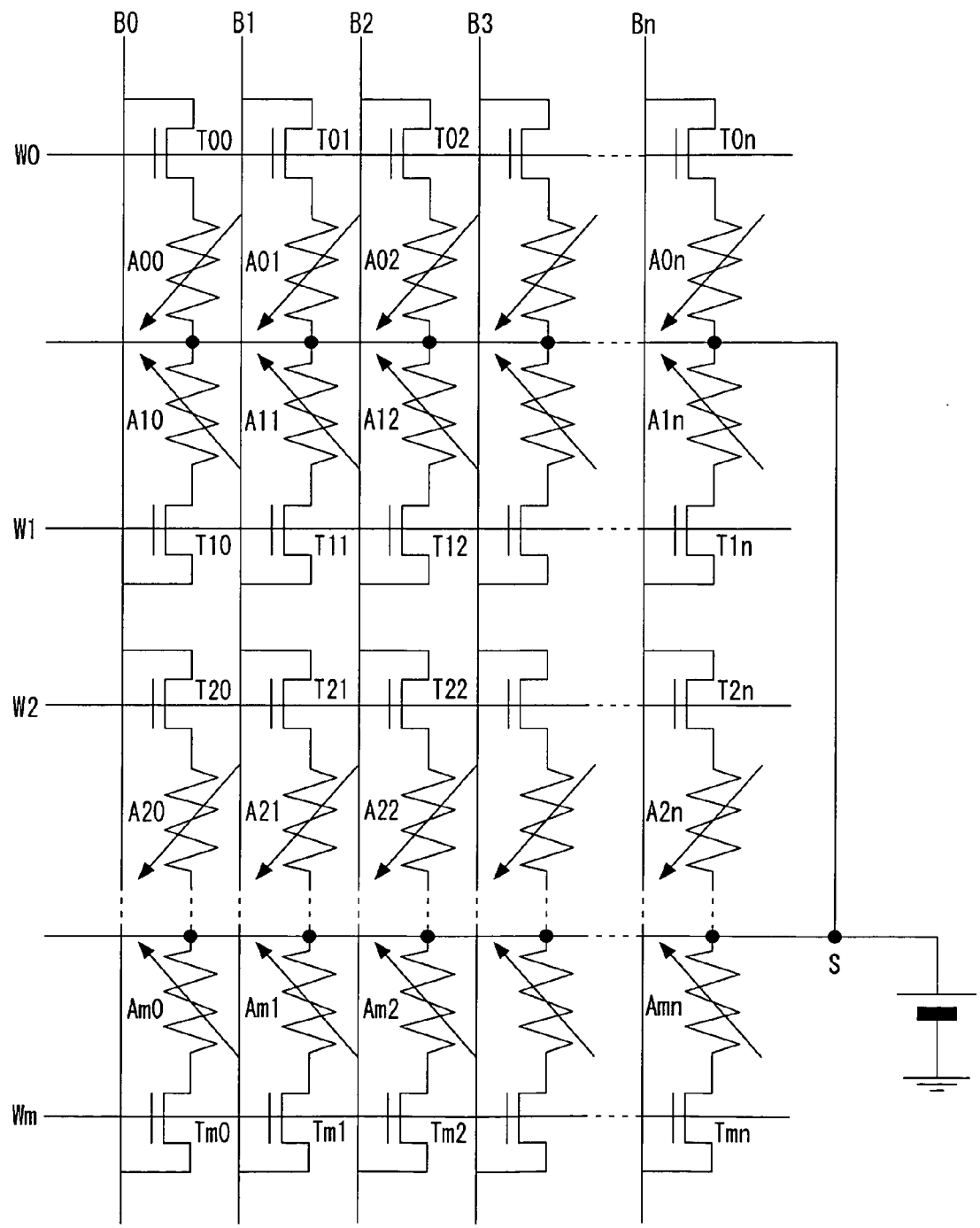
FIG. 3 is a circuit diagram (1) for explaining one example of the storage apparatus to which the present invention is applied.
Figure 4:
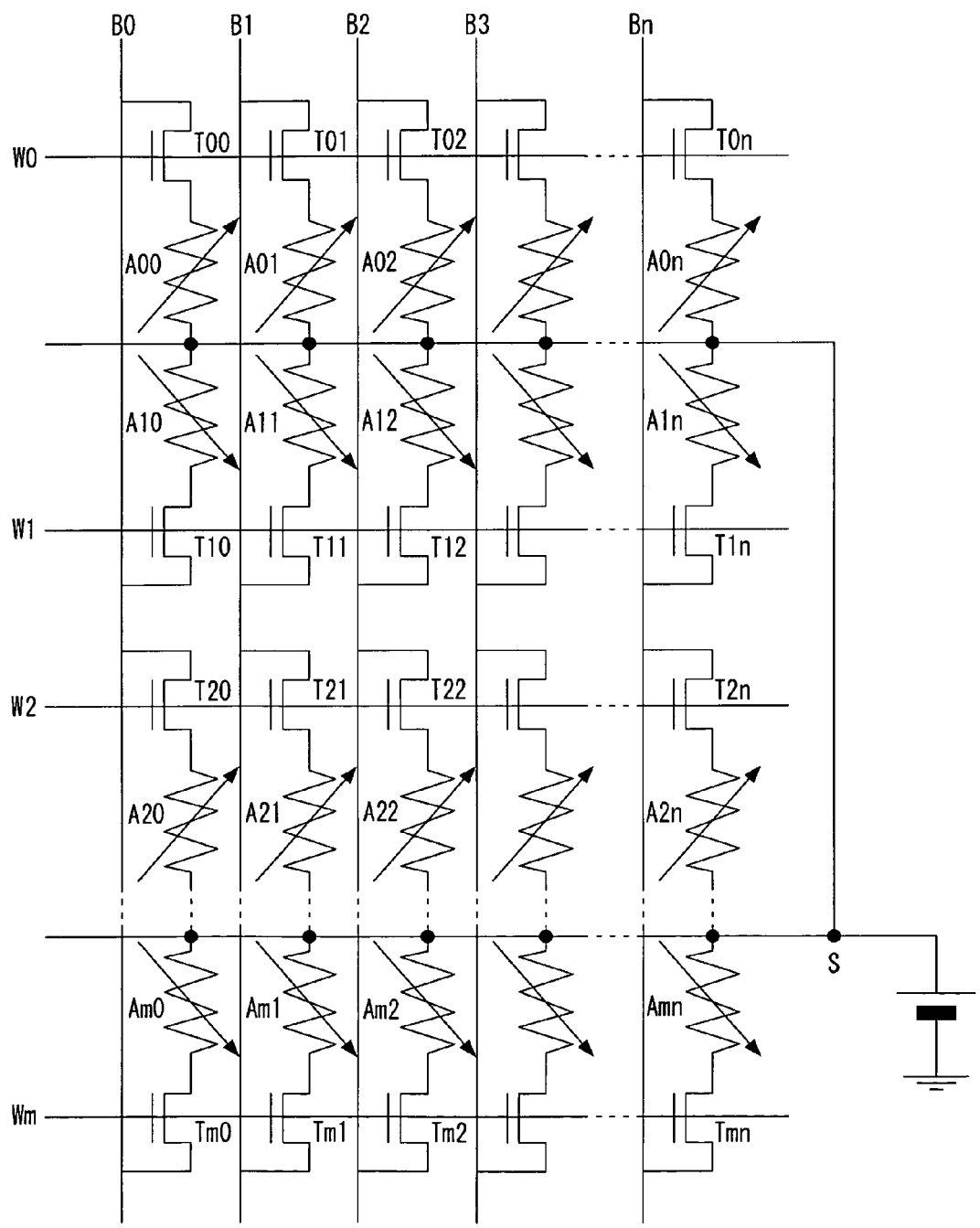
FIG. 4 is a circuit diagram (2) for explaining one example of the storage apparatus to which the present invention is applied.
Figure 5:
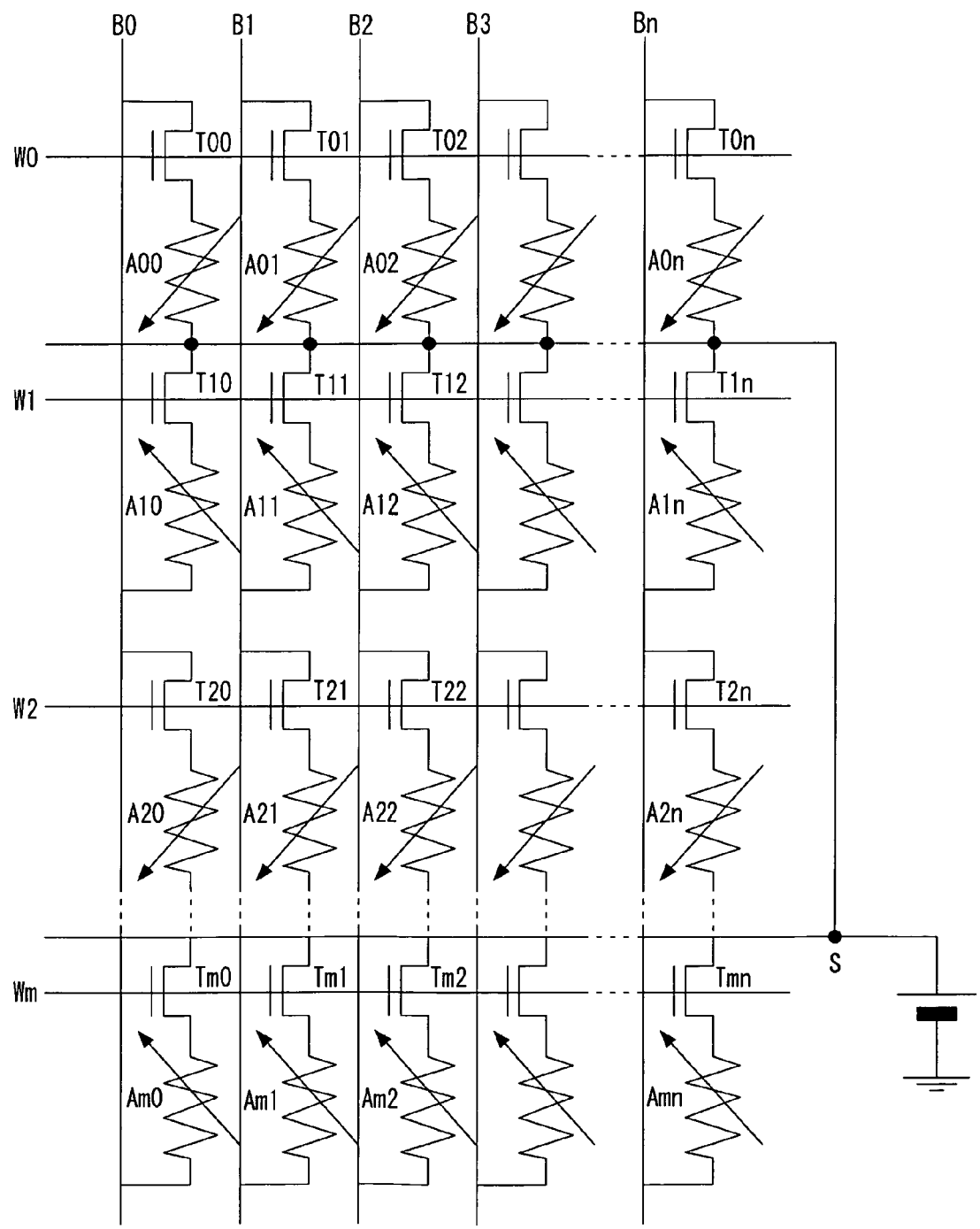
FIG. 5 is a circuit diagram (3) for explaining one example of the storage apparatus to which the present invention is applied.
Figure 6:
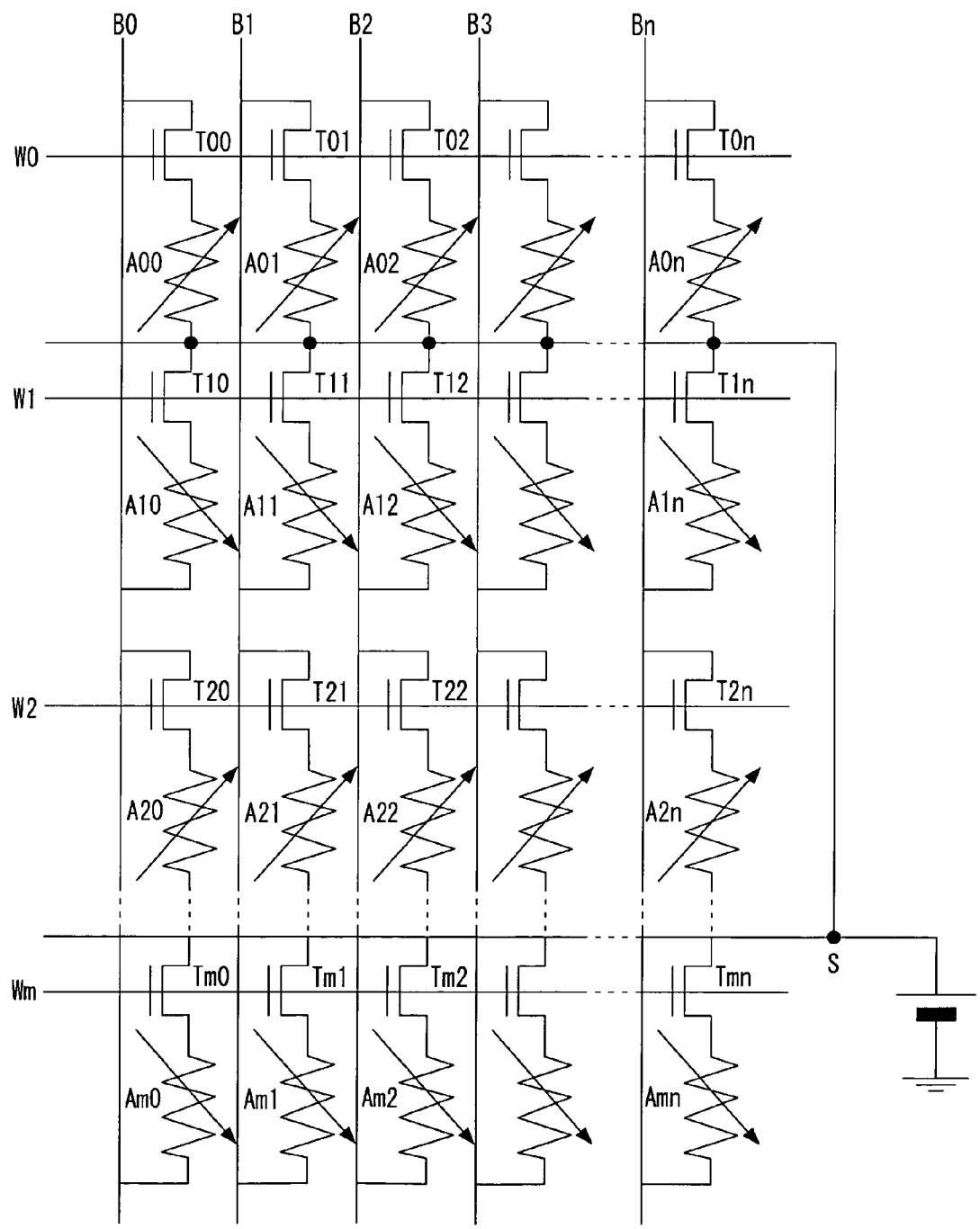
FIG. 6 is a circuit diagram (4) for explaining one example of the storage apparatus to which the present invention is applied.

Here, since methods for operating the memory arrays are the same in FIGS. 3 to 6, a description of the method is given, taking the circuit of FIG. 3 as one example.

The storage apparatus as shown in FIG. 3 is structured such that (m+1) rows and (n+1) columns of memory devices are arranged in a matrix, and each of the memory devices is structured by connecting one terminal of the memory element to one terminal of the MOS transistor (a source, here), as shown in FIGS. 2A and 2B.

Furthermore, a gate of the MOS transistors T (T00 to Tmn) is connected to a word line W (W0 to Wm), the other terminal of the MOS transistor (drain) is connected to a bit line B (B0 to Bn), and the other terminal of the memory element is connected to a common line S.

In the storage apparatus structured as described above, (1) writing, (2) erasing, and (3) reading can be performed in the following manner, for example.

(1) Writing

The writing of a memory cell is performed in such a manner that a power supply voltage Vdd (2.5 V) is applied to the word line corresponding to the memory cell to record information on, a power supply voltage Vdd (2.5 V) is applied to the bit line corresponding to the memory cell to record information on, and a voltage Vdd/2 (1.25 V) is applied to the common line to apply a voltage Vdd/2 (1.25 V) to the memory element, which exceeds the writing voltage threshold (0.5 V), so that the memory element is changed from an insulation state with a high resistance value (1 MΩ or higher) to a conduction state with a low resistance value (several kΩ).

In order to prevent writing in the memory cell not to record information on, 0 V is applied to the word lines other than the word line corresponding to the memory cell to write information on, and the same potential as in the common line is applied to the bit lines other than the bit line corresponding to the memory cell to record information on.

Here, as long as a voltage not lower than the writing voltage threshold is applied to the memory element, the potential applied to the bit line does not always need to be Vdd. Similarly, as long as a voltage not lower than the writing voltage threshold is applied to the memory element, the potential applied to the common line does not always need to be Vdd/2.

(2) Deletion

The erasing of a memory cell is performed in such a manner that Vdd is applied to the word line corresponding a memory cell to erase information from, a ground potential (0 V) is applied to the bit line corresponding to the memory cell to erase information from, and Vdd/2 is applied to the common line to apply Vdd/2 to the memory element in an opposite direction of writing. In the case of erasing, unlike writing, a voltage determined by a resistance of the memory element and a partial pressure of the on-resistance of the MOS transistor is applied to the memory element, which exceeds the erasing voltage threshold (−0.5 V), so that the conduction state with a low resistance value (several kΩ) to the insulation state with a high resistance value (1 MΩ or higher).

In order to prevent erasing in the memory cell not to erase information from, 0 V is applied to the word lines other than the word line corresponding to the memory cell to erase information from, and the same potential as in the common line is applied to the bit lines other than the bit line corresponding to the memory cell to erase information from.

Here, as long as a voltage not lower than the erasing voltage threshold is applied to the memory element, the potential applied to the bit line does not always need to be a ground voltage. Similarly, as long as a voltage not lower than the erasing voltage threshold is applied to the memory element, the potential applied to the common line does not always need to be Vdd/2.

Heretofore, the case where writing or erasing is performed for one memory cell to record information on or to erase information from is described. In a case where writing or erasing is performed for a plurality of memory devices connected to one word line, to each of the bit lines is applied Vdd when writing, and is applied 0 V when erasing. When performing neither writing nor erasing, the same potential as in the common line is applied to each of the bit lines and further, 0 V is applied to each of the memory devices. In this manner, writing or erasing of a plurality of memories as needed is performed. Thus, in order to perform writing or erasing for the plurality of memory devices, the potential of the common line needs to be the same at the time of writing and erasing operations.

In the case where writing or erasing is performed for only one memory cell in the memory array, the common potential does not need to be the same at the time of writing and erasing operations. In order to randomly perform writing and erasing continuously at a high speed, it is preferable that the potential of the common line is the same at the time of writing and erasing operations.

(3) Reading

Reading from the memory cell is performed in such a manner that Vdd is applied to the word line corresponding to the memory cell to read information from, and Vdd/2+0.2 V or Vdd/2−0.2 V is applied to the bit line corresponding to the memory cell to read information from, and Vdd/2 is applied to the common line. At this time, since the voltage of 0.2 V or −0.2 V is applied between the bit line and the source line, neither writing nor erasing is performed. Any voltage may be applied between the bit line and the source line, as long as it is within a range in which neither writing nor erasing is performed.

Next, when the bit line comes into a floating state (high impedance state), (A) when the memory element is in a conduction state, the potential applied to the bit line is changed from Vdd/2±0.2 V to Vdd/2 which is applied to the source line, and (B) when the memory element is in an insulation state, the potential applied to the bit line is kept Vdd/2±0.2 V. Accordingly, a difference in voltage between the cases of (A) and (B) is determined by a sense amplifier to determine the conduction state or the insulation state of the memory element.

0 V is applied to the word lines other than the word line corresponding to the memory cell to be read, and the same potential as in the common line is applied to the bit lines other than the bit line corresponding to the memory cell to be read. However, there is no problem in applying Vdd/2±0.2 V to the bit lines other than the bit line corresponding to the memory cell to be read.

In the above-described manner, the writing, erasing and reading of the memory cell are performed. Next, an optimal potential applied to the common line is described.

Figure 7:
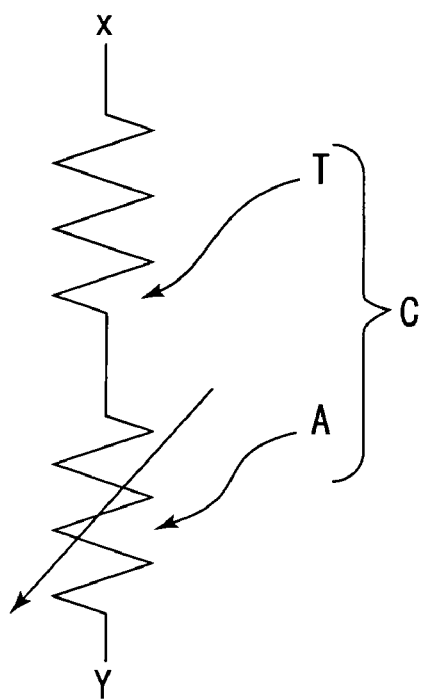
FIG. 7 is a circuit diagram for explaining a concept of a phenomenon that a resistance of a memory element immediately after writing is determined according to a current flowing in the memory element.

First, from experiments, it is known that a resistance immediately after writing of the memory element used in the present invention is not a unique value to the element, but is determined according to a current flowing in the memory element immediately after writing. FIG. 7 is a circuit diagram for explaining a concept of a phenomenon that the resistance of the memory element immediately after writing is determined according to the current flowing in the memory element, in which the memory element and a load resistance are connected in series. The memory element is in the insulation state, that is, in a state in which a resistance value is 1 MΩ or higher.

When 0.5 V which is the writing voltage threshold is applied between both terminals X, Y in a writing direction in FIG. 7, the resistance value of the memory element is sufficiently higher than the load resistance value connected thereto in series, and thus, the voltage of 0.5 V is applied in the memory element, so that the memory element shifts from the insulation state to the conduction state.

Also, from experiments, it is known that the voltage between both terminals of the memory element immediately after writing is constant (for example, about 0.2 V) regardless of the value of the load resistance connected thereto in series. Therefore, [1] when the load resistance value is 1 kΩ, a current of (0.5V−0.2V)/1 kΩ=0.3 mA flows, and the resistance value of the memory element is 0.2V/0.3 mA=0.67 kΩ, and [2] when the load resistance value is 10 kΩ, a current of (0.5V−0.2V)/10 kΩ=0.03 mA flows, and the resistance value of the memory element is 0.2V/0.03 mA=6.7 kΩ.

Thus, the resistance value of the memory element immediately after writing is determined according to the current flowing in the memory element, and the determined resistance value after writing is not changed and becomes constant unless it exceeds the erasing voltage threshold (in a voltage direction opposite to writing).

In the case of erasing, the above-described phenomenon is not generated, but the insulation resistance value is changed from several ten kΩ to 1 MΩ or higher regardless of the writing resistance value.

In light of the foregoing, an optimal potential applied to the common line is described, using a specific example.

EXAMPLE

Figure 8:
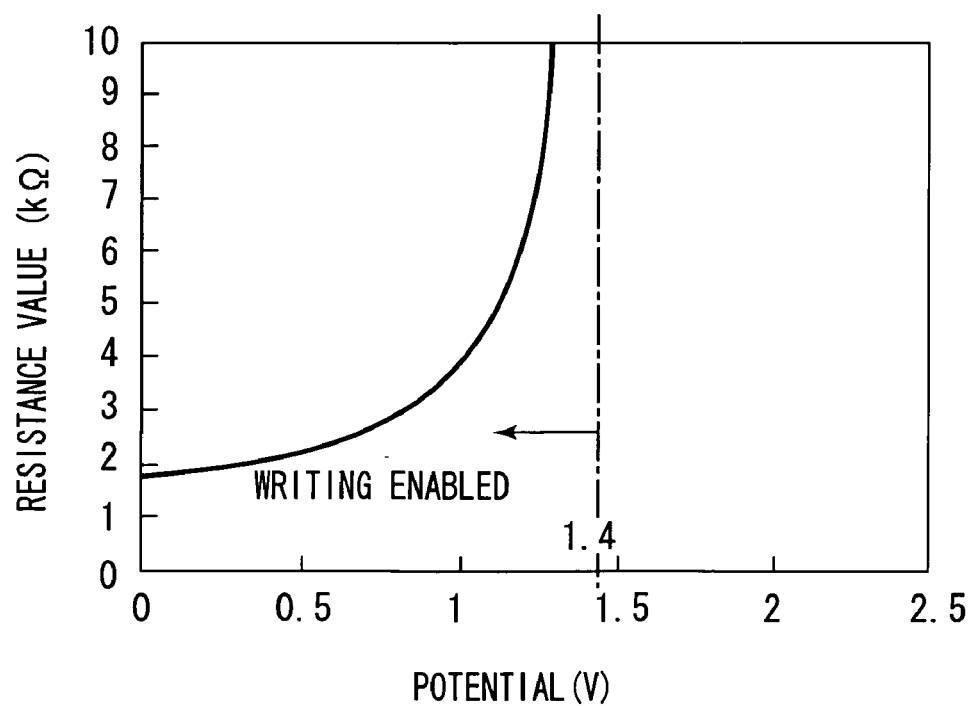
FIG. 8 is a graph showing a relationship between a resistance value immediately after writing into the memory element and a potential applied to a common line.

FIG. 8 shows a relationship between the resistance value immediately after writing into the memory element and the potential applied to the common line in a case where a gate potential (potential applied to the word line) of 2.5 V is applied and the potential between the bit line and the source line of 0.5 V is applied in the memory cell in the above-described circuit diagram shown in FIG. 3.

FIG. 8 indicates that if the potential applied to the common line is 1.4 V or higher, writing is disabled. This is because as the potential applied to the common line is increased, the gate potential of the MOS transistor relatively becomes lower, that is, the on-resistance of the MOS transistor becomes higher, and the resistance value of the memory element immediately after writing become higher, and thus when the potential applied to the common line is 1.4 V or higher, the potential between the bit line and the common line becomes lower than (voltage threshold of MOS transistor)+(writing voltage threshold of the memory element).

Figure 9:
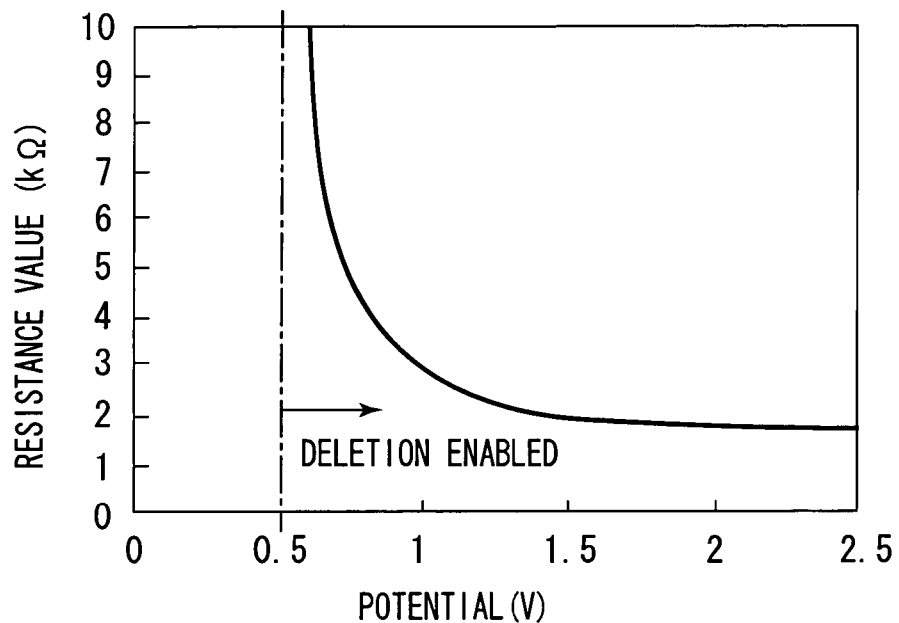
FIG. 9 is a graph showing a relationship between an erasing-enabling minimum resistance value of the memory element and the potential applied to the common line.

FIG. 9 shows a relationship between an erasing-enabling minimum resistance value of the memory element and the potential applied to common line in a case where the gate potential of 2.5 V is applied and the bit potential (potential applied to the bit line) is 0 V in the memory cell in the above-described circuit diagram shown in FIG. 3.

Here, the voltage applied between the bit line and the common line is divided in a ratio of the on-resistance of the MOS transistor to the resistance of the memory element, and thus, if the conduction (writing) resistance of the memory element is low, the voltage applied to the memory element becomes lower than the erasing voltage threshold, thereby disabling erasing. On the other hand, when the potential applied to the common line is increased, the current flowing in the memory element is increased, and (erasing-enabling resistance value)=(erasing voltage threshold)/(current value flowing in the memory cell), so that a lower limit of the erasing-enabling resistance value becomes lower.

If the potential applied to the common line is 0.5 V or higher, the voltage in the memory element becomes the erasing threshold 0.5 V or lower, so that erasing is disabled at any resistance value.

Figure 10:
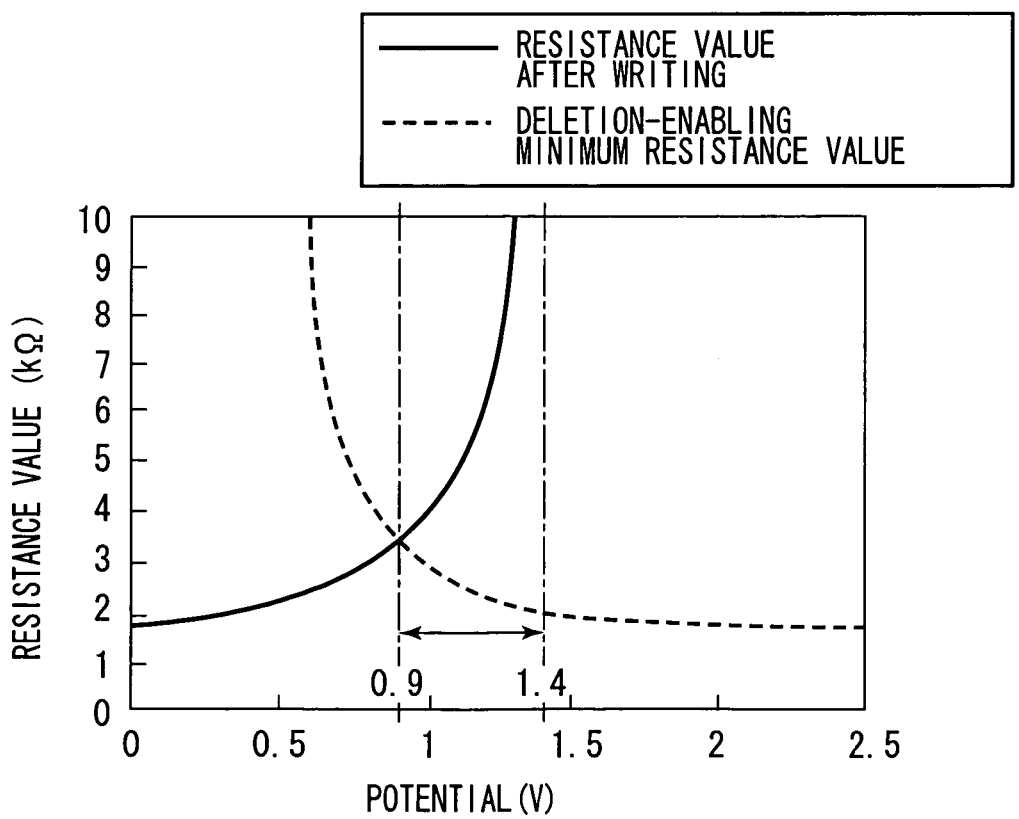
FIG. 10 is a graph obtained by superimposing the graph shown in FIG. 8 and the graph shown in FIG. 9.

FIG. 10 is a diagram obtained by superimposing FIGS. 8 and 9 described above. FIG. 10 shows, <1> in a case where the potential applied to the common line is set within a range of 0.9 V to 1.4 V, writing is enabled and erasing is enabled, <2> in a case where the potential applied to the common line is set to 0.9 V or lower, writing is enabled but erasing is disabled because the resistance value immediately after writing is too low, and <3> in a case where the potential applied to the common line is set to 1.4 V or higher, erasing is enabled but writing is disabled.

Accordingly, in order to operate both writing and erasing, the potential applied to the common line needs to be set within the range of 0.9V to 1.4V.

As the resistance value of the memory element is lower, a larger reading current can be taken, and thus it is desirable that the potential applied to the common line is as low as possible within the range of 0.9 V to 1.4 V.

Here, in the storage apparatus to which the present invention is applied, a description was given, taking, as an example, the case where one bit is composed by one MOS transistor and one memory element, and the insulation state of the memory element is assigned to data 0 while the conduction state of the memory element is assigned to data 1, thereby enabling one bit of data to be stored. However, one bit of structure does not need to be composed by one MOS transistor and one memory element. For example, two MOS transistors and two memory elements arranged right and left may compose one bit, and a case where the left memory element is in the insulation state and the right memory element is in the conduction state may be assigned to data 0, while a case where the left memory element is in the conduction state and the right memory element is in the insulation state may be assigned to data 1. Furthermore, a state in which both of the right and left memory elements are in the conduction state or in the insulation state may be prohibited. This also allows one bit of data to be stored.

In the storage apparatus to which the present invention is applied, by setting so as to apply a potential within an optimal range to the common line, that is, a potential (in Example, 0.9 V to 1.4 V) satisfying both of a potential condition enabling writing into the memory element (in Example, a potential lower than 1.4 V) and a potential condition enabling erasing from the memory element after writing (in Example, potential higher than 0.9 V), the writing and erasing of the memory element are enabled.

Furthermore, by supplying the common potential (in Example, a fixed potential within the range of 0.9 V to 1.4 V) to one terminal of the memory cell, the writing, erasing and reading operations can be performed within a range of a ground voltage to a power supply voltage. Thus, a boosting circuit is unnecessary, so that the simplification of the writing circuit and the erasing circuit is realized, and a reduction in power consumption can be achieved.

Moreover, one of the electrodes of each of the memory elements is connected to the source-drain terminal of each of the MOS transistors, while the other electrode of each of the memory elements is connected to each other in all the memory devices, which can bring about a reduction of the memory cell in area.

Furthermore, the supply of the common potential to the one terminal of the memory cell prevents floating (high impedance) of the common line, and thus, stable memory operation can be expected.

It should be understood by those skilled in the art that various modifications, combinations, sub-combinations and alterations may occur depending on design requirements and other factors insofar as they are within the scope of the appended claims or the equivalents thereof.

The present invention contains subject mater related to Japanese Patent Application No. JP2004-284500 filed in the Japanese Patent Office on Sep. 29, 2004, the entire contents of which being incorporated herein by reference.

What is claimed is:

1. A storage apparatus comprising:
   memory devices, each having (1) a storage element configured such that the application of an electric signal not lower than a first threshold signal allows the storage element to shift from a high resistance value state to a low resistance value state, and such that the application of an electric signal not lower than a second threshold signal, which has a polarity different from that of the first threshold signal, allows the storage element to shift form a low resistance value state to a high resistance value state, and (2) a circuit element connected in series to the storage element to be a load; and
   a common line,
   wherein,
   the memory devices are arranged in a matrix and one terminal of each of the memory devices is connected to the common line, and
   an intermediate potential between a power supply potential and a ground potential is applied to the common line, the power supply potential and the ground potential being different from one another.

2. The storage apparatus according to claim 1, wherein said intermediate potential is set within a range in which the application of the electric signal not lower than the first threshold signal to the storage element allows a resistance value of the storage element to change from a high state to a low state, and also, within a range in which the storage element which has come into the low resistance value state by applying the electric signal not lower than the first threshold signal can shift from the low resistance value state to the high resistance value state.

3. The storage apparatus according to claim 2, wherein said intermediate potential preferably falls in a range from 0.9 V to 1.4 V.

4. The storage apparatus according to claims 2 or 3, wherein said intermediate potential is selected as the lowest potential in the range.

5. The storage apparatus according to claim 1, wherein said storage element comprises a storage layer sandwiched by a first electrode and a second electrode, and the application of the electric signal not lower than the first threshold signal between the first electrode and the second electrode allows the storage element to shift from the high resistance value state to the low resistance value state, and the application of the electric signal not lower than the second threshold signal between the first electrode and the second electrode allows the store element to shift from the lower resistance value state to the high resistance value state.

6. The storage apparatus according to claim 1, wherein said electric signal is a voltage signal.

7. A semiconductor apparatus having a storage apparatus, said storage apparatus comprising:
   memory devices, each having (1) a storage element configured such that the application of an electric signal not lower than a first threshold signal allows the storage element to shift from a high resistance value state to a low resistance value state, and such that the application of an electric signal not lower than a second threshold signal, which has a polarity different from that of the first threshold signal, allows the storage element to shift form a low resistance value state to a high resistance value state, and (2) a circuit element connected in series to the storage element to be a load; and
   a common line, wherein, the memory devices are arranged in a matrix and one terminal of each of the memory devices is connected to the common line, and an intermediate potential between a power supply potential and a ground potential is applied to the common line, the power supply potential and the ground potential being different from one another.

8. The semiconductor apparatus according to claim 7, wherein said intermediate potential is set within a range in which the application of the electric signal not lower than the first threshold signal to the storage element allows a resistance value of the storage element to change from a high state to a low state, and also, within a range in which the storage element which has come into the low resistance value state by applying the electric signal not lower than the first threshold signal can shift from the low resistance value state to the high resistance value state.

9. The semiconductor apparatus according to claim 8, wherein said intermediate potential preferably falls in a range from 0.9 V to 1.4 V.

10. The semiconductor apparatus according to claims 8 or 9, wherein said intermediate potential is selected as the lowest potential in the range.

11. The semiconductor apparatus according to claim 7, wherein said storage element comprises a storage layer sandwiched by a first electrode and a second electrode, and the application of the electric signal not lower than the first threshold signal between the first electrode and the second electrode allows the storage element to shift from the high resistance value state to the low resistance value state, and the application of the electric signal not lower than the second threshold signal between the first electrode and the second electrode allows the store element to shift from the lower resistance value state to the high resistance value state.

12. The semiconductor apparatus according to claim 7, wherein said electric signal is a voltage signal.

* * * * *